United States Patent [19]

Kitagawa

[11] Patent Number: 5,187,225
[45] Date of Patent: Feb. 16, 1993

[54] SEALANT COMPOUND WITH CARBON FIBER MIXED THEREIN

[75] Inventor: Hiroji Kitagawa, Nagoya, Japan

[73] Assignee: Kitagawa Industries Co., Ltd., Aichi, Japan

[21] Appl. No.: 427,525

[22] Filed: Oct. 27, 1989

[30] Foreign Application Priority Data

Nov. 2, 1988 [JP] Japan .................................. 63-278114

[51] Int. Cl.$^5$ ........................... C08K 3/4; C08L 75/04
[52] U.S. Cl. ................................ 524/847; 524/871; 524/872; 524/873; 524/874; 524/875
[58] Field of Search ............... 524/871, 872, 873, 874, 524/875, 847

[56] References Cited

U.S. PATENT DOCUMENTS

| | | | |
|---|---|---|---|
| 3,669,920 | 6/1972 | Haggis et al. | 524/871 |
| 4,439,576 | 3/1984 | O'Conner et al. | 524/875 |
| 4,727,128 | 2/1988 | Pedain et al. | 524/873 |

FOREIGN PATENT DOCUMENTS

| | | |
|---|---|---|
| 0267603 | 11/1986 | European Pat. Off. . |
| 2608549 | 2/1986 | France . |
| 60-159031 | 8/1985 | Japan . |
| 63-286437 | 11/1988 | Japan . |
| 1297585 | 3/1971 | United Kingdom . |
| 1486033 | 2/1975 | United Kingdom . |

Primary Examiner—Melvyn I. Marquis
Assistant Examiner—Karen A. Dean
Attorney, Agent, or Firm—Oliff & Berridge

[57] ABSTRACT

The sealant compound of this invention comprises polyurethane resin or its precursor mixed with vapor grown carbon fiber. In the compound, whisker-shaped carbon fibers with high tensile strength intertwine and form lattices. In addition, carbon fibers are anchored in the polyurethane resin. Consequently, the compound of this invention has more tensile strength than the conventional compound containing black carbon. Thus the seal consisting of the compound of this invention has high adhesion and sealing effects.

12 Claims, No Drawings

SEALANT COMPOUND WITH CARBON FIBER MIXED THEREIN

BACKGROUND OF THE INVENTION

This invention relates to a sealant compound for sealing and filling a gap.

In related arts, various kinds of resins are used for a sealant. The sealant fits the gap in a housing using its rubber-like elasticity to secure the contents of the housing and prevent the contents from being interfered with from the outside. For example, an O ring made of synthetic resin, or a synthetic resin packing adaptable to the configuration of the gap is used. Another known sealant is an adhesive compound that can also be used as an adhesive. In addition, a sealant for sealing joints in the housing of an automobile transmission, a sealant for shielding an automobile windowpane, and a sealant for sealing joints in an architectural panel are known.

To enhance the strength of the seals having rubber-like elasticity so that they can be used in severe conditions, various compositions of known resin, filler, plasticizer or other materials that govern the physical strength of the seals are reviewed. The reviewed compositions only provide a limited strength to the seals, however.

SUMMARY OF THE INVENTION

An object of this invention is to provide a sealant compound having enhanced physical strength.

This object is attained by a sealant compound with carbon fiber mixed therein. The sealant compound comprises polyurethane resin and carbon fiber. The carbon fiber is mixed with polyurethane resin or a precursor of the polyurethane resin. The carbon fiber is manufactured through a vapor-phase system. In the vapor-phase system, ultrafine particles of a high-melting metal or its compound are suspended in the zone in which hydrocarbon is thermally decomposed.

Polyurethane resin is generally produced by reacting polyisocyanate with polyol, water, polyamine, aminoalcohol, etc. and curing ("Polyurethane Resin, Journal of Plastics Material 2" published by Japan Daily Industrial Newspaper Co. Ltd.).

The precursor of polyurethane resin is a substance that precedes a chemical reaction for producing polyurethane resin, such as polyisocyanate, polyol, water, polyamine, aminoalcohol, or the like. The precursor can be supplied in a single-liquid form or double-liquid form. The single-liquid type of the precursor can change to a rubberlike elastic body by reacting with moisture in the air. The double-liquid type of the precursor can be changed to the rubberlike elastic body by mixing a first liquid with a second liquid.

In addition to the carbon fiber, known compounds can be mixed with the polyurethane resin.

The carbon fiber is manufactured through a vapor-phase system by suspending ultrafine powder of high-melting metal or high-melting metal compound in the thermal decomposition zone of hydrocarbon. The carbon fiber is whisker-shaped, as disclosed in Japan Published Examined Patent Application No. 62-242 and Japan Published Unexamined Patent Application Nos. 60-27700, 62-95351, 60-38472, and 59-179816. The high-melting metal does not gasify at 950° C. to 1300° C., the temperature range in which hydrocarbon is thermally decomposed. For the high-melting metal, available is titanium (Ti), zirconium (Zr) or the like in group IVa according to the periodic system, vanadium (V), niobium (Nb) or tantalum (Ta) in group Va, chromium (Cr), molybdenum (Mo) or the like in group VIa, manganese (Mn) or the like in group VIIa, or iron (Fe), cobalt (Co), nickel (Ni) or the like in group VIII. Metals Fe, Co, Ni, V, Nb, Ta, Ti, and Zr are best. The oxide, nitride, chloride or the like of the metals is used as the high-melting metal compound.

Japan Published Examined Application No. 62-242 discloses a method of successively manufacturing carbon fiber having branches by a vapor-phase system in which ultrafine particles of a high-melting metal and/or high-melting metal compound are suspended on a floating bed in a three-dimensional reaction zone. Hydrocarbon is thermally decomposed in a thermal decomposition zone of hydrocarbon in which the ultrafine particles of a high-melting metal and/or a high-melting metal compound are floated.

In Japan Published Unexamined Patent Application No. 60-27700, carbon fiber is prepared continuously and with high efficiency by introducing a compound containing a transition metal to a zone to precipitate carbon fiber, decomposing it thermally, and precipitating particles of the transition metal on a substrate. The substrate is set at a carrier gas inlet of a reaction equipped with nichrome wire and the substrate is introduced into the reactor in a horizontal direction at $\leq 3.0$ cm/min linear speed. The reaction temperature is maintained at 1,000°–1,300° C. and the substrate at $\leq 1,120°$ C. A mixed gas of a gas of an organic compound containing a transition metal of the formula $M(C_2H_5)_2$ (where M is a transition metal), a hydrocarbon gas, and a carrier gas is fed to the reactor. The hydrocarbon is thermally decomposed by catalytic action of the transition so that carbon fiber is formed on the substrate.

Japan Published Unexamined Application No. 62-95351 discloses a method of obtaining carbon black of composite structure continuously and efficiently by adding a metallic compound in a gaseous state to a furnace and carrying out a thermal decomposition reaction of an acetylene gas and form fibrous carbon by a gaseous phase method in the same furnace simultaneously. A reaction furnace is charged with a metallic compound (e.g. ferric nitrate, cobalt chloride, etc.) in a gaseous phase, an acetylene gas, a carrier gas (preferably hydrogen gas) and, if necessary, an unsaturated hydrocarbon. A thermal decomposition reaction of the acetylene gas and formation of fibrous carbon by a gaseous phase method are simultaneously carried out and the fibrous carbon is grown from carbon particles to give the aimed carbon black of composite structure. A ratio of the prepared carbon black of composite structure and the fibrous carbon is preferably 1-200 pts. wt. fibrous carbon based on 100 pts. wt. carbon black.

Japan Published Unexamined Patent Application No. 60-38472 discloses carbon black having improved electrical conductivity and processability by carrying fine particles of a metal or a metallic compound on carbon black and introducing a hydrocarbon gas. Carbon black is seeded with fine particles of a metal or a metallic compound and fed to an externally heated tubular furnace. While keeping the temperature at 900°–1,500° C., a vaporized hydrocarbon gas and a carrier gas such as hydrogen gas are introduced to grow fibrous carbon within the voids of carbon black by a vapor phase method. Fine fibrous carbon having a diameter of hundreds to thousands of Angstroms starting from the ultrafine metallic particles supported on the carbon black is grown within voids between the textures of carbon black while crowning the fibrous carbon with the ultrafine metallic particle, whereby a composite structure is formed. It is desirable that the ratio of the fibrous carbon to carbon black is 50 wt. % or below, the length of the fibrous carbon is 1 mm or shorter, and the diameter thereof is 50 μ or less.

Japan Published Unexamined Patent Application No. 59-179816 discloses a titled graphite fiber having high electrical conductivity comparable with metal, good wetting properties with metal, and stability in air, wherein $FeCl_3$ is penetrated into the crystal face of graphite fiber having a concentric crystal structure to form an interlaminar compound. Graphite fiber and $FeCl_3$ are placed in a glass tube, heated preferably at 250°–400° C. under reduced pressure wherein $FeCl_3$ is evaporated and the interior of the tube is kept in an atmosphere of $FeCl_3$ gas to give the desired graphite fiber wherein $FeCl_3$ is penetrated into the crystal face of the graphite fiber having concentric crystal structure to form an interlaminar compound.

The carbon fiber should be mixed in the precursor of the polyurethane resin prior to curing so that the precursor can be fluid enough to be easily treated. After curing, the polyurethane resin should contain between 5% and 30% by weight of the carbon fiber. The polyurethane resin mixed with 5% to 30% by weight of the carbon fiber has wear resistance and breaking strength. When the double-liquid type of the precursor is used, the carbon fiber can be mixed into both or either of the first and second liquids.

Packings or sealants composed of the polyurethane resin in which 20% to 30% by weight of the carbon fiber is mixed can have high conductivity and strength, and can provide electromagnetic-shielding effect.

If required, a known filler, plasticizer, or deterioration-preventive agent can be mixed in the sealant compound with the carbon fiber mixed therein so as to modify the properties of the compound.

An O ring, a packing, or other formed seal of the compound of this invention can be applied to gaps in a housing. A single-liquid type of the compound is discharged in a strand of beads using a known delivering apparatus to form a seal onto an edge of a housing, or other place. By closing the housing with a cover, the seal adhering to the edge fills the gap between the housing and the cover. A double-liquid type of the compound is discharged using a known fixed-amount delivering apparatus provided with a mixer. By mixing first liquid with second liquid by the fixed amount, the compound is discharged onto the edge of the housing to form the seal onto the edge of the housing.

The single-liquid type compound can be supplied using a pail or a cartridge and discharged mechanically or by using a manual gun.

When the sealant requires more adhesion, known various resins for providing adhesion can be added to the sealant compound. A surface can be coated with primer before the sealant is applied to the surface so as to provide or enhance adhering effect.

Since conductive carbon fiber is used in the compound of this invention, by adjusting the amount of the carbon fiber mixed into the polyurethane resin, the sealant compound can have variable conductivity. When the seal of the compound is applied to the housing of electronic equipment, it can protect the electronic equipment from dust, particles, moisture and toxic gas, and also function as an electrostatic discharge shielding material to protect the electronic equipment from static electricity. It can also be used as a shielding material to prevent electromagnetic waves from entering or leaking from the electronic equipment in the housing. In combination with a magnetic substance, the seal can be used as an electromagnetic-interference shielding material to protect the electronic equipment or a magnetic recording element from electromagnetic waves.

What is claimed is:

1. A sealant composition comprising:
   polyurethane resin; and
   between 5% and 30% by weight of vapor grown carbon fibers manufactured by a vapor phase system in which ultra fine particles of high melting metallic compound are suspended on a floating bed in a three dimensional reaction zone in which hydrocarbon is thermally decomposed, based on 100% by weight of said polyurethane resin;
   where said carbon fibers are mixed into the polyurethane resin so that said carbon fibers enhance the physical strength of the polyurethane resin; and
   wherein said sealant composition has a rubbery elasticity.

2. The sealant composition of claim 1, wherein the carbon fibers are whisker shaped.

3. The sealant composition of claim 1, wherein the carbon fibers are mixed into a precursor of the polyurethane resin prior to curing.

4. The sealant composition of claim 3, wherein the precursor is a single-liquid form of precursor.

5. The sealant composition of claim 3, wherein the precursor is a double-liquid form of precursor.

6. The sealant composition of claim 1, further comprising additives chosen from the group consisting of fillers, plasticizers, deteriorization-preventative agents, and resins for providing adhesion, where at least one such additive is mixed into the polyurethane resin to modify the properties thereof.

7. The sealant composition of claim 1, wherein said carbon fibers are less than 1 mm in length.

8. The sealant composition of claim 1, wherein the content of vapor grown carbon fiber manufactured by a vapor phase system in which ultra fine particles of high melting metallic compound are suspended on a floating bed in a three dimensional reaction zone in which hydrocarbon is thermally decomposed, in said sealant composition is 20% to 30% by weight based upon 100% by weight of said polyurethane resin.

9. The sealant composition of claim 1, wherein said carbon fibers are vapor grown carbon fibers.

10. A sealant composition consisting essentially of:
    polyurethane resin; and
    between 5% and 30% by weight of vapor grown carbon fibers manufactured by a vapor phase system in which ultra fine particles of high melting metallic compound are suspended on a floating bed in a three dimensional reaction zone in which hydrocarbon is thermally decomposed, based on 100% by weight of said polyurethane resin;
    where the carbon fibers are mixed into the polyurethane resin so that the carbon fibers enhance the physical strength of the polyurethane resin; and
    wherein said sealant composition has a rubbery elasticity.

11. A sealant composition of claim 1, wherein said metallic compound is selected from the group consisting of vanadium, niobium, tantalum, chromium, molybdenum, manganese, cobalt, iron, nickel and oxides, chlorides and nitrides thereof.

12. A sealant composition of claim 1, wherein said fine particles of metallic compound crown said vapor grown carbon fibers.

* * * * *